(12) United States Patent
Yagi et al.

(10) Patent No.: US 11,425,843 B2
(45) Date of Patent: Aug. 23, 2022

(54) HEAT RADIATION STRUCTURE

(71) Applicant: NEC Platforms, Ltd., Kawasaki (JP)

(72) Inventors: Takahiro Yagi, Kanagawa (JP);
Kiyotaka Yokoyama, Kanagawa (JP);
Akira Katsumata, Kanagawa (JP);
Wataru Imura, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 16/635,273

(22) PCT Filed: Aug. 8, 2017

(86) PCT No.: PCT/JP2017/028658
§ 371 (c)(1),
(2) Date: Jan. 30, 2020

(87) PCT Pub. No.: WO2019/030809
PCT Pub. Date: Feb. 14, 2019

(65) Prior Publication Data
US 2020/0375065 A1    Nov. 26, 2020

(51) Int. Cl.
*H05K 7/20* (2006.01)
*H01L 23/367* (2006.01)

(52) U.S. Cl.
CPC ....... *H05K 7/20518* (2013.01); *H01L 23/367* (2013.01); *H05K 7/20127* (2013.01); *H05K 7/20436* (2013.01); *H05K 7/20445* (2013.01)

(58) Field of Classification Search
CPC .......... H05K 7/20127; H05K 7/20436–20445; H05K 7/20518; H05K 7/20963–20972; H01L 23/367
See application file for complete search history.

(56) References Cited

U.S. PATENT DOCUMENTS 2,737,029 A * 3/1956 Krasner ................ F25D 23/003
62/454
5,991,155 A * 11/1999 Kobayashi .......... H01L 23/3672
165/80.2
(Continued)

FOREIGN PATENT DOCUMENTS

| CN | 102017134 A | 4/2011 |
| CN | 106470538 A | 3/2017 |

(Continued)

OTHER PUBLICATIONS

International Search Report for PCT Application No. PCT/JP2017/028658, dated Nov. 7, 2017.

(Continued)

*Primary Examiner* — Robert J Hoffberg
(74) *Attorney, Agent, or Firm* — Sughrue Mion, PLLC

(57) ABSTRACT

A heat radiation structure (10) includes a casing (4) configured to accommodate a heating element (1), and a heat-sink type component (2) configured to directly or indirectly absorb heat from the heating element (1), contactlessly face the casing (4), and conduct the heat to the casing (4) via air existing in an internal space of the casing (4), wherein at least either the heat-sink type component (2) or the casing (4) is configured in such a way that, when heat is generated from the heating element (1), a distance between the heat-sink type component (2) and the casing (4) becomes nearer in a region of the internal space (3) in which temperature does not rise relatively easily than in a region of the internal space (3) in which temperature rises relatively easily.

5 Claims, 8 Drawing Sheets

(56) References Cited

U.S. PATENT DOCUMENTS

| | | | |
|---|---|---|---|
| 6,570,086 B1* | 5/2003 | Shimoji | H05K 7/20445 |
| | | | 174/377 |
| 7,408,777 B2* | 8/2008 | Jeong | H05K 7/20963 |
| | | | 165/104.33 |
| 8,576,565 B2* | 11/2013 | Matsumoto | H01L 23/467 |
| | | | 361/697 |
| 8,760,868 B2* | 6/2014 | Diep | H05K 13/00 |
| | | | 361/702 |
| 8,902,588 B2* | 12/2014 | Ritter | H05K 7/20445 |
| | | | 361/692 |
| 9,095,076 B2* | 7/2015 | Diep | H05K 7/20436 |
| 9,220,185 B2* | 12/2015 | Ritter | H05K 7/20409 |
| 9,265,180 B2* | 2/2016 | Dernier | H05K 7/2049 |
| 9,392,317 B2* | 7/2016 | Bose | H04N 21/418 |
| 9,414,530 B1* | 8/2016 | Howard | G06F 1/1656 |
| 9,578,783 B2* | 2/2017 | Ritter | H01L 23/4006 |
| 9,600,042 B2* | 3/2017 | Tsunoda | G06F 1/203 |
| 9,907,208 B2* | 2/2018 | Bose | H01L 23/4093 |
| 10,039,209 B1* | 7/2018 | Howard | H05K 7/20481 |
| 10,383,254 B2* | 8/2019 | Chang | G06F 1/20 |
| 2002/0089825 A1 | 7/2002 | Sasaki et al. | |
| 2003/0161132 A1* | 8/2003 | Shimoji | H01L 23/433 |
| | | | 361/800 |
| 2006/0187643 A1* | 8/2006 | Tsurufusa | H05K 7/2049 |
| | | | 361/704 |
| 2008/0158817 A1* | 7/2008 | Tsunoda | G06F 1/203 |
| | | | 361/697 |
| 2009/0145581 A1* | 6/2009 | Hoffman | H01L 23/473 |
| | | | 165/80.3 |
| 2011/0122574 A1* | 5/2011 | Tsunoda | H05K 7/20445 |
| | | | 361/679.54 |
| 2011/0128706 A1* | 6/2011 | Tsunoda | G06F 1/203 |
| | | | 361/704 |

FOREIGN PATENT DOCUMENTS

| | | |
|---|---|---|
| JP | H07-169886 A | 7/1995 |
| JP | 2002-134968 A | 5/2002 |
| JP | 2009-147599 A | 7/2009 |
| JP | 2010-251386 A | 11/2010 |
| JP | 2012-160651 A | 8/2012 |
| JP | 2016-042582 A | 3/2016 |

OTHER PUBLICATIONS

Chinese Office Action for CN Application No. 201780093709.2 dated Feb. 20, 2021 with English Translation.

Japanese Office Communication for JP Application No. 2019-535462 dated Oct. 5, 2021 with English Translation.

* cited by examiner

HEAT RADIATION STRUCTURE

This application is a National Stage Entry of PCT/JP2017/028658 filed on Aug. 8, 2017, the contents of all of which are incorporated herein by reference, in their entirety.

TECHNICAL FIELD

The present invention relates to a heat radiation structure.

BACKGROUND ART

There is known a heat radiation structure which includes a heating element and a heat-sink type component inside a casing, and which conducts heat generated from the heating element to the casing via the heat-sink type component, and further radiates heat from the casing to outside air. In such a heat radiation structure, how efficiently heat generated from the heating element is radiated to outside air is important.

Patent Literature 1 discloses a heat radiation structure (electronic instrument) including a first flat portion facing a heating element (heating component), and a second flat portion, wherein the first flat portion includes a heat conduction sheet protruding toward the heating component side from the second flat portion, a surface on the heating component side in the first flat portion is thermally coupled to the heating component, and a surface on a side opposite to the heating component in the second flat portion is thermally coupled to an inner surface of a storage body.

CITATION LIST

Patent Literature

[Patent Literature 1] Japanese Unexamined Patent Application Publication No. 2016-042582

SUMMARY OF INVENTION

Technical Problem

By the way, when heat generated from a heating element is conducted to a casing via a heat-sink type component, temperature of the casing rises. In a heat radiation structure, an upper limit temperature (e.g., a standard value of a surface temperature of the heat radiation structure) in an outer surface of a casing is generally specified. In other words, the whole region of the outer surface of the casing needs to be less than or equal to the upper limit temperature.

FIG. 8 is a schematic view (sectional view) illustrating a heat radiation structure involving a problem to be solved by the present invention. Note that a right-handed xyz coordinate illustrated in FIG. 8 serves for convenience to describe a position relation of components. As illustrated in FIG. 8, a heat radiation structure 910 includes a casing 904 configured to accommodate a heating element 901, and a heat-sink type component 902 configured to directly or indirectly absorb heat from the heating element 901, and conduct the heat to the casing 904 via air existing in an internal space 903 of the casing 904. The heat-sink type component 902 contactlessly faces the casing 904.

In the internal space 903, air on an upper side in a vertical direction is relatively high in temperature, and air on a lower side in the vertical direction is relatively low in temperature. For example, it is assumed that an X-axis direction is a vertical direction in FIG. 8. In the internal space 903, air warmed by the heating element 901 and the heat-sink type component 902 which has absorbed heat of the heating element 901 inflates and decreases in density, and therefore, rises due to buoyancy resulting from the density difference (hereinafter, this state is expressed as natural convection). Thus, temperature of air in a region 903a on the upper side in the vertical direction (a positive side of the X-axis direction) in the internal space 903 becomes relatively high, and temperature of air in a region 903b on the lower side in the vertical direction (a negative side of the X-axis direction) in the internal space 903 becomes relatively low. In the casing 904 which contacts the internal space 903 being in such a state and to which heat is conducted via air in the internal space 903 as well, temperature of a part 904a on the upper side in the vertical direction becomes relatively high, and temperature of a part 904b on the lower side in the vertical direction becomes relatively low.

When a temperature distribution is in a non-uniform state in the casing 904 of the heat radiation structure 910, the part 904a on the upper side in the vertical direction being highest in temperature in the casing 904 has to be less than or equal to an upper limit temperature. Thus, in the part 904b on the lower side in the vertical direction being relatively low in temperature in the casing 904, temperature is much lower than the upper limit temperature. In other words, in the part 904b on the lower side in the vertical direction being relatively low in temperature in the casing 904, there still remains room to be able to radiate heat, and heat radiation performance is not fully used.

In this way, when a temperature distribution is in a non-uniform state in the casing, heat radiation efficiency of the heat radiation structure 910 is poor. Thus, in a heat radiation structure, it is desired to transfer heat from a heat-sink type component to a casing in such a way that a temperature distribution of the casing becomes close to a uniform state.

The present invention has been made in view of the background described above, and is intended to provide a heat radiation structure which can transfer heat from a heat-sink type component to a casing in such a way that a temperature distribution of the casing becomes close to a uniform state.

Solution to Problem

The present invention provides a heat radiation structure including a casing configured to accommodate a heating element, and a heat-sink type component configured to directly or indirectly absorb heat from the heating element, contactlessly face the casing, and conduct the heat to the casing via air existing in an internal space of the casing, wherein at least either the heat-sink type component or the casing is configured in such a way that, when heat is generated from the heating element, a distance between the heat-sink type component and the casing becomes nearer in a region of the internal space in which temperature does not rise relatively easily than in a region of the internal space in which temperature rises relatively easily.

Furthermore, the present invention provides a manufacturing method of a heat radiation structure including a casing configured to accommodate a heating element, and a heat-sink type component configured to directly or indirectly absorb heat from the heating element, and conduct the heat to the casing via air existing in an internal space of the casing and forming at least either the heat-sink type component or the casing in such a way that, when heat is generated from the heating element, a distance between the heat-sink type component and the casing becomes nearer in a region of the internal space in which temperature rises relatively easily than in a region of the internal space in which temperature does not rise relatively easily.

Advantageous Effects of Invention

According to the present invention, heat can be transferred from a heat-sink type component to a casing in such a way that a temperature distribution of the casing becomes close to a uniform state.

DESCRIPTION OF EMBODIMENTS

Figure 1:
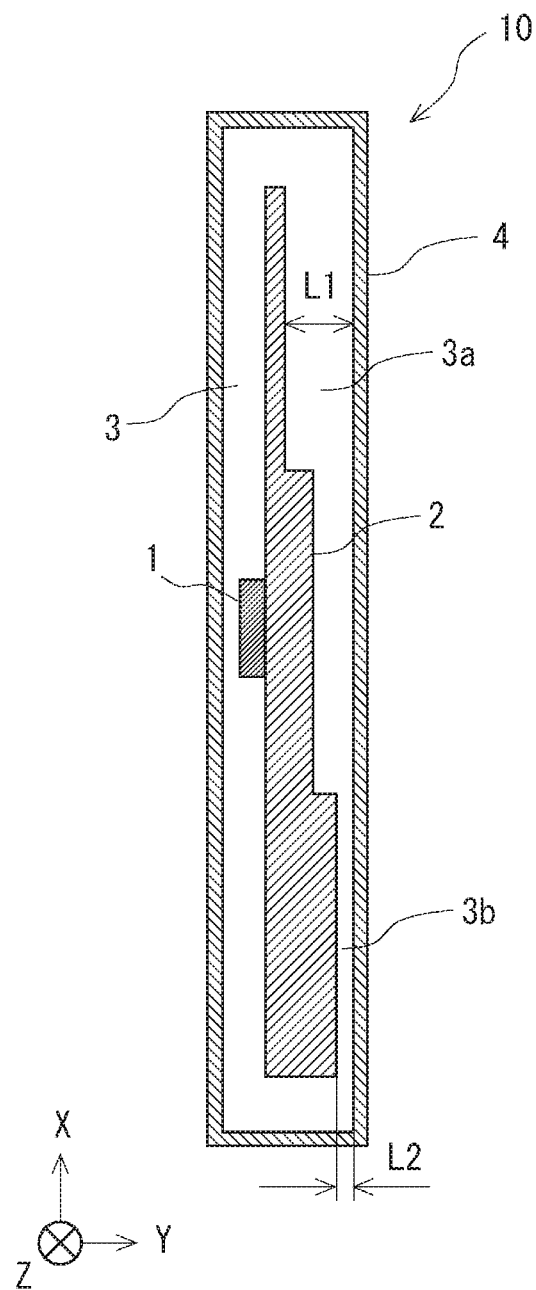
FIG. 1 is a view describing an overview of the present invention.

Hereinafter, example embodiments of the present invention will be described with reference to the drawings. For clarification of description, the following description and the drawings are appropriately omitted and simplified. In each drawing, the same reference sign is given to the same element, and repeated description is omitted as required. Moreover, a right-handed xyz coordinate illustrated in the drawings serves for convenience to describe a position relation of components.

Characteristic of the Present Invention

Prior to description of the example embodiments of the present invention, an overview of a characteristic of the present invention is described first. Note that a heat radiation structure according to the present invention is a natural air cooling type using a heat-sink type component, is not limited to an instrument in a specific field, and may be any instrument, such as an electronic instrument, including a heating element therein. Thus, in the following description, a structure of the heat radiation structure is in a form simplified as much as possible.

FIG. 1 is a view describing an overview of the present invention. As illustrated in FIG. 1, a heat radiation structure 10 includes a casing 4 configured to accommodate a heating element 1, and a heat-sink type component 2 configured to directly or indirectly absorb heat from the heating element 1, and conduct the heat to the casing 4 via air existing in an internal space 3 of the casing 4. The heat-sink type component 2 contactlessly faces the casing 4.

The casing 4 is an exterior of a device. The casing 4 is generally configured and assembled by a plurality of components, but is illustrated herein as an integral component for convenience. Moreover, although holes for air intake and exhaust are generally formed in the casing 4 in order to efficiently perform natural air cooling, the heat radiation structure according to the present invention can exert a desired effect regardless of the presence or absence of a hole, and therefore, a case where holes for air intake and exhaust are not formed in the casing 4 is described below.

The heating element 1 is a component which is stored inside the casing 4 and which voluntarily generates heat, and includes a wide range of components such as an electronic component on a substrate, and a motor. Although a plurality of heating elements generally exist inside the casing 4 in a device such as an electronic instrument, description is given below assuming one heating element for simplification. The heat-sink type component 2 denotes a structure in general having a function and assignment for conduction, diffusion, and radiation of heat, regardless of a form.

In the heat radiation structure 10, contact between the heating element 1 and the heat-sink type component 2 is generally indirect contact across a heat conduction mediation member such as a heat-conducting sheet or grease, rather than direct contact. However, since whether contact between the heating element 1 and the heat-sink type component 2 is direct or indirect does not particularly have an influence in describing the present invention, illustration in the drawings and description of the heat conduction mediation member is omitted. The internal space 3 of the casing 4 is divided into a plurality of parts by a threshold, a structure, and the like in many cases, but is illustrated as being integral in the following description and the drawings for convenience.

In the heat radiation structure 10 of a natural air cooling type, a temperature distribution is generally in a non-uniform state in the internal space 3. Although there are various factors which make a temperature difference in the internal space 3, natural convection of air, for example, is conceivable. In other words, due to natural convection, air being relatively high in temperature in the internal space 3 moves upward, and air being relatively low in temperature moves downward.

It is assumed that, in the heat radiation structure 10, when heat is generated from the heating element 1, a region of the internal space 3 in which temperature does not rise relatively easily is a low-temperature region 3b, and a region of the internal space 3 in which temperature rises relatively easily is a high-temperature region 3a. In the heat radiation structure 10, at least either the heat-sink type component 2 or the casing 4 is configured in such a way that a distance between the heat-sink type component 2 and the casing 4 becomes nearer in the low-temperature region 3b than in the high-temperature region 3a. In other words, a shape of at least either the heat-sink type component 2 or the casing 4 is adjusted in such a way that a distance L2 between the heat-sink type component 2 and the casing 4 in the low-temperature region 3b becomes nearer than a distance L1 between the heat-sink type component 2 and the casing 4 in the high-temperature region 3a.

In the manufacture of the heat radiation structure 10, when heat is generated from the heating element 1, at least either the heat-sink type component 2 or the casing 4 is formed in such a way that a distance between the heat-sink type component 2 and the casing 4 becomes nearer in a region of the internal space 3 in which temperature does not rise relatively easily than in a region of the internal space 3 in which temperature rises relatively easily.

Thereby, heat can be transferred from a heat-sink type component to a casing in such a way that a temperature distribution of the casing becomes close to a uniform state.

Example Embodiment 1

Hereinafter, Example Embodiment 1 of the present invention is described with reference to the drawings.

First, a configuration of a heat radiation structure according to Example Embodiment 1 of the present invention is described.

Figure 2:
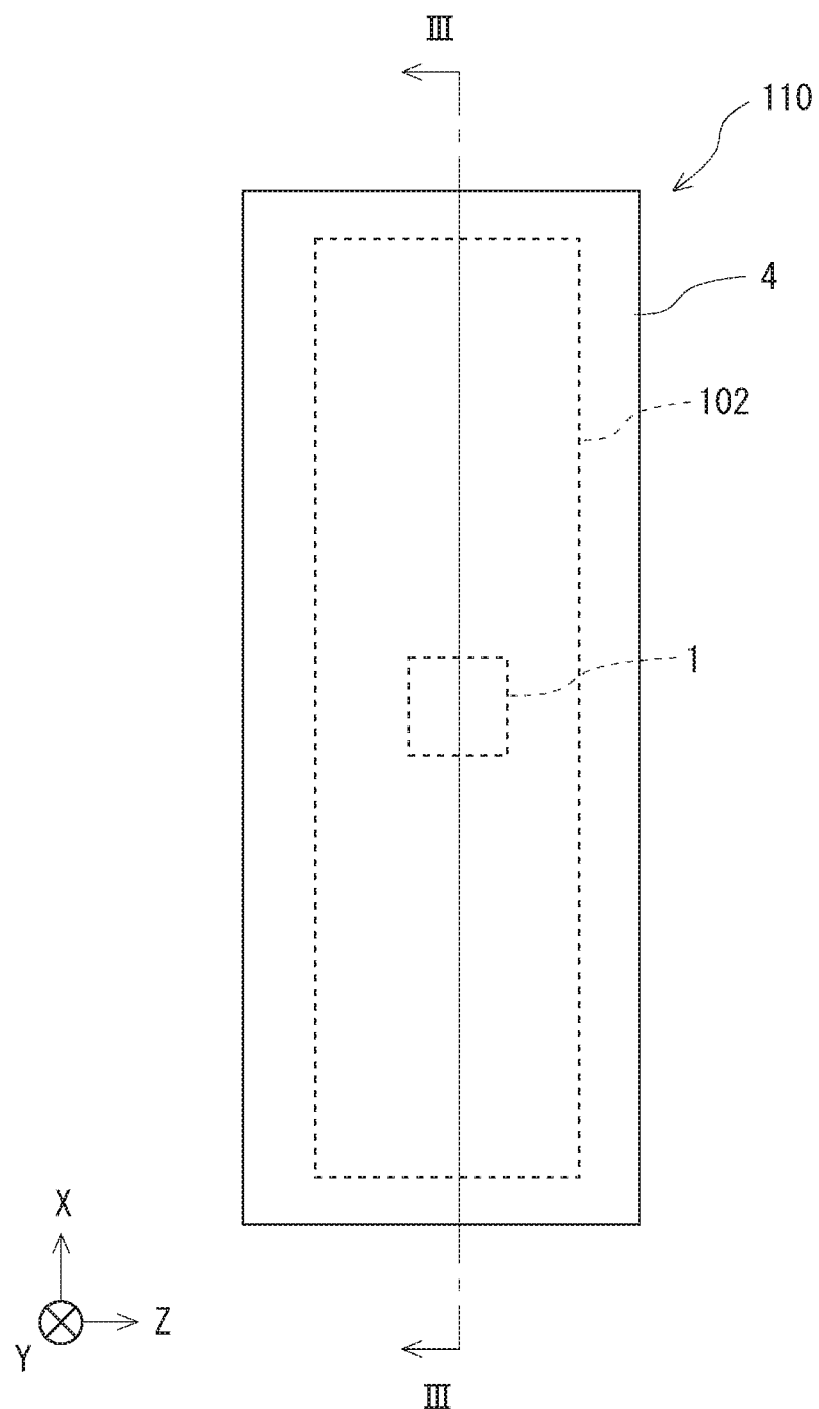
FIG. 2 is a plan view illustrating a schematic configuration of a heat radiation structure according to Example Embodiment 1.
Figure 3:
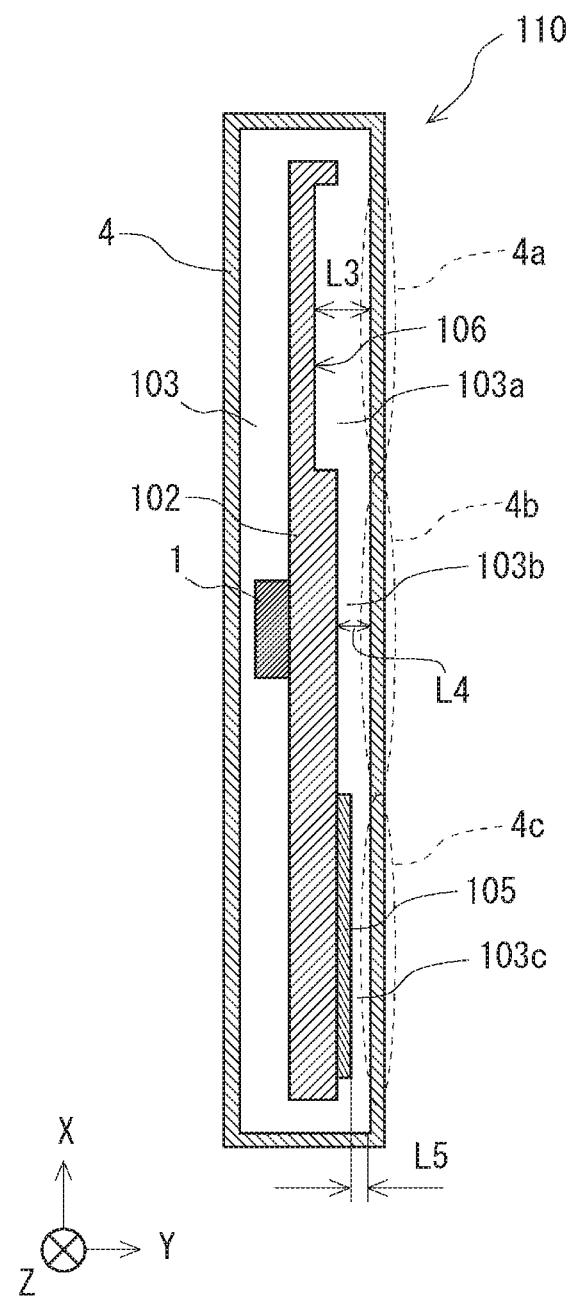
FIG. 3 is a sectional view along the line in FIG. 2.

FIG. 2 is a plan view illustrating a schematic configuration of a heat radiation structure 110 according to Example Embodiment 1. FIG. 3 is a sectional view along the line in FIG. 2. Herein, an X-axis direction is a vertical direction (in the X-axis direction, a positive side is an upper side, and a negative side is a lower side). As illustrated in FIGS. 2 and 3, the heat radiation structure 110 includes a heating element 1, a casing 4, and a heat-sink type component 102.

Heat of the heating element 1 is transferred to the heat-sink type component 102 by inter-component heat conduction. Air in an internal space 103 of the casing 4 is warmed by conduction of heat from the heat-sink type component 102 which has absorbed heat from the heating element 1. The casing 4 rises in temperature by receiving heat from the heat-sink type component 102 due to heat transmission and emission via air in the internal space 103, and further radiates heat to outside air.

In the internal space 103, due to natural convection, air being relatively high in temperature moves upward, and air being relatively low in temperature moves downward. Thus, in the internal space 103 of the casing 4 illustrated in FIG. 3, an upper side in the vertical direction becomes a high-temperature region 103$a$ which becomes relatively high in temperature, and a lower side in the vertical direction becomes a low-temperature region 103$c$ which becomes relatively low in temperature. Moreover, a middle part in the vertical direction becomes an intermediate-temperature region 103$b$ being a temperature range between the high-temperature region 103$a$ and the low-temperature region 103$c$.

In the heat-sink type component 102, a first projecting portion 105 extending toward the casing 4, and having a tip portion contactlessly facing the casing 4 is formed on a surface contacting a region (the low-temperature region 103$c$) of the internal space 103 in which temperature does not rise relatively easily. Moreover, in the heat-sink type component 102, a first depressed portion 106 is formed on a surface contacting a region (the high-temperature region 103$a$) region of the internal space 103 in which temperature rises relatively easily. Assuming that distances between the heat-sink type component 102 and the casing 4 are L3 in the high-temperature region 103$a$, L4 in the intermediate-temperature region 103$b$, and L5 in the low-temperature region 103$c$, a magnitude relation of these distances is L3>L4>L5. In other words, the heat-sink type component 102 is configured in such a way that, when heat is generated from the heating element 1, a distance between the heat-sink type component 102 and the casing 4 becomes nearer in a region of the internal space 103 in which temperature does not rise relatively easily than in a region of the internal space 103 in which temperature rises relatively easily.

A distance between the heat-sink type component 102 and the casing 4 is related to a heat transfer amount between the heat-sink type component 102 and the casing 4, and when a distance between the heat-sink type component 102 and the casing 4 is relatively short, a heat transfer amount becomes greater than when the distance is relatively long. In other words, when a distance between the heat-sink type component 102 and the casing 4 is made nearer, a heat transfer amount from the heat-sink type component 102 to the casing 4 increases.

As described above, in the internal space 103, temperature is relatively high in the high-temperature region 103$a$, temperature is relatively low in the low-temperature region 103$c$, and temperature is in a temperature range between the high-temperature region 103$a$ and the low-temperature region 103$c$, in the intermediate-temperature region 103$b$. On the other hand, since a distance between the heat-sink type component 102 and the casing 4 is L3>L4>L5 as described above, heat is not relatively easily conducted to a contact part (part 4$a$) in the casing 4 in the high-temperature region 103$a$, and heat is relatively easily conducted to a contact part (part 4$c$) in the casing 4 in the low-temperature region 103$c$. Moreover, in the intermediate-temperature region 103$b$, ease of heat conduction to a contact part (part 4$b$) in the casing 4 is between that in the high-temperature region 103$a$ and that in the low-temperature region 103$c$. Thus, a temperature distribution in the casing 4 can be uniformed by making nearer a distance between the heat-sink type component 102 and the casing 4 in such a way that heat is not easily transferred in a region of the internal space 103 in which temperature does not rise relatively easily than in a region of the internal space 103 in which temperature rises relatively easily.

Consequently, the heat radiation structure 110 according to the present example embodiment can transfer heat from a heat-sink type component to a casing in such a way that a temperature distribution of the casing becomes close to a uniform state.

Example Embodiment 2

Hereinafter, Example Embodiment 2 of the present invention is described with reference to the drawings. In the heat radiation structure according to Example Embodiment 1, a shape of a heat-sink type component is adjusted in such a way that, when heat is generated from a heating element, a distance between the heat-sink type component and a casing becomes nearer in a region of an internal space in which temperature does not rise relatively easily than in a region of the internal space in which temperature rises relatively easily. In contrast, in a heat radiation structure according to Example Embodiment 2, not a shape of a heat-sink type component but a shape of a casing is adjusted.

Figure 4:
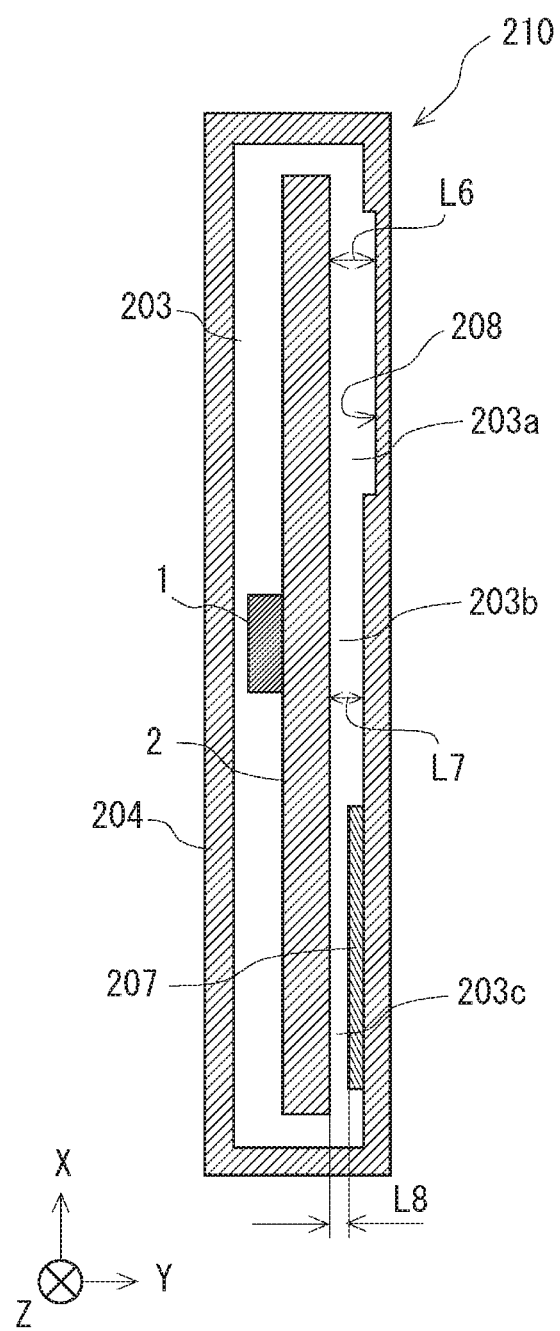
FIG. 4 is a sectional view illustrating a schematic configuration of a heat radiation structure according to Example Embodiment 2.

FIG. 4 is a sectional view illustrating a schematic configuration of a heat radiation structure 210 according to Example Embodiment 2. Note that FIG. 4 corresponds to the sectional view of the heat radiation structure 110 in Example Embodiment 1 illustrated in FIG. 3. A right-handed xyz coordinate illustrated in FIG. 4 is coincident with that in FIG. 3, and an X-axis direction is a vertical direction. As illustrated in FIG. 4, the heat radiation structure 210 includes a heating element 1, a casing 204, and a heat-sink type component 2.

In an internal space 203, due to natural convection, an upper side in the vertical direction becomes a high-temperature region 203$a$ region in which temperature rises relatively easily, a lower side in the vertical direction becomes a low-temperature region 203$c$ in which temperature does not rise relatively easily, and a middle part in the vertical direction becomes an intermediate-temperature region 203b being a temperature range between the high-temperature region 203a and the low-temperature region 203c. In the casing 204, a second projecting portion 207 extending toward the heat-sink type component 2, and having a tip portion contactlessly facing the heat-sink type component 2 is formed on a surface contacting a region (the low-temperature region 203c) of the internal space 203 in which temperature does not rise relatively easily. Moreover, in the casing 204, a second depressed portion 208 is formed on a surface contacting a region (the high-temperature region 203a) region of the internal space 203 in which temperature rises relatively easily.

Assuming that distances between the heat-sink type component 2 and the casing 204 are L6 in the high-temperature region 203a, L7 in the intermediate-temperature region 203b, and L8 in the low-temperature region 203c, L6>L7>L8. In other words, the casing 204 is configured in such a way that, when heat is generated from the heating element 1, a distance between the heat-sink type component 2 and the casing 204 becomes nearer in a region of the internal space 203 in which temperature does not rise relatively easily than in a region of the internal space 203 in which temperature rises relatively easily. A temperature distribution in the casing 204 can be uniformed as in the heat radiation structure 110 according to Example Embodiment 1, by causing a distance between the heat-sink type component 2 and the casing 204 to be nearer in a region of the internal space 203 in which temperature does not rise relatively easily than in a region of the internal space 203 in which temperature rises relatively easily.

Consequently, the heat radiation structure 210 according to the present example embodiment can transfer heat from a heat-sink type component to a casing in such a way that a temperature distribution of the casing becomes close to a uniform state.

Example Embodiment 3

Hereinafter, Example Embodiment 3 of the present invention is described with reference to the drawings. As in the heat radiation structure according to Example Embodiment 2, in a heat radiation structure according to Example Embodiment 3, a shape of a casing is adjusted in such a way that, when heat is generated from a heating element, a distance between a heat-sink type component and the casing becomes nearer in a region of an internal space in which temperature does not rise relatively easily than in a region of the internal space in which temperature rises relatively easily.

Figure 5:
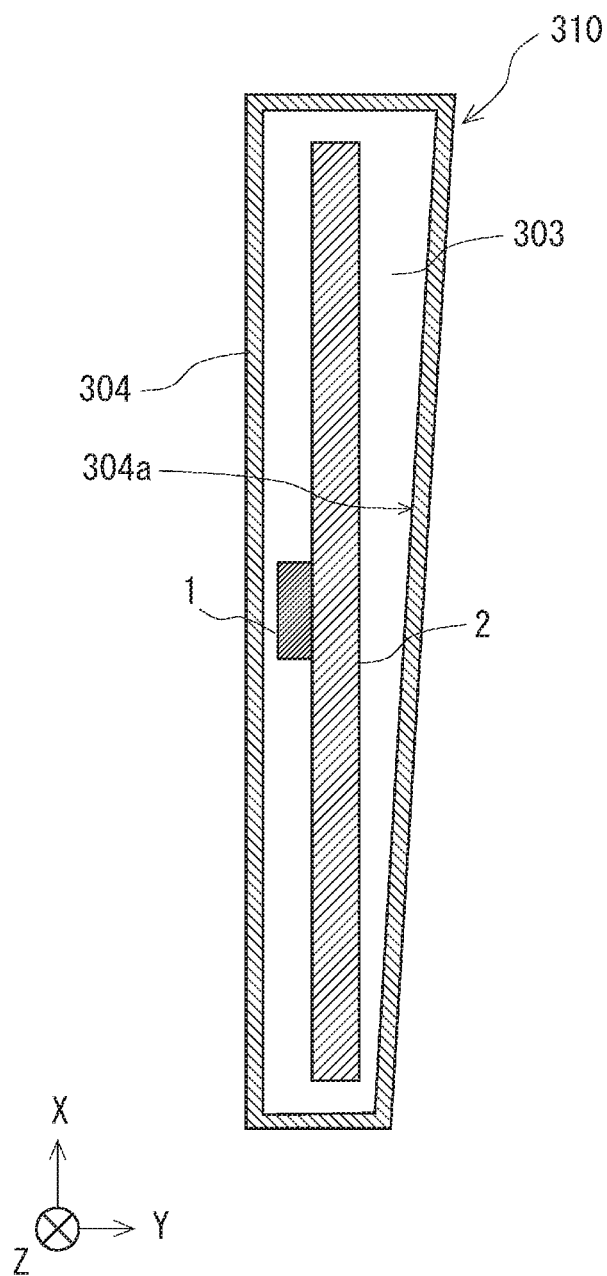
FIG. 5 is a sectional view illustrating a schematic configuration of a heat radiation structure according to Example Embodiment 3.

FIG. 5 is a sectional view illustrating a schematic configuration of a heat radiation structure 310 according to Example Embodiment 3. Note that FIG. 5 corresponds to the sectional view of the heat radiation structure 110 in Example Embodiment 1 illustrated in FIG. 3. A right-handed xyz coordinate illustrated in FIG. 5 is coincident with that in FIG. 3, and an X-axis direction is a vertical direction. As illustrated in FIG. 5, the heat radiation structure 310 includes a heating element 1, a casing 304, and a heat-sink type component 2.

In an internal space 303, due to natural convection, temperature becomes higher toward an upper side in a vertical direction. A wall surface 304a facing the heat-sink type component 2 in the casing 304 is formed in such a way that a distance between the heat-sink type component 2 and the casing 304 broadens toward the upper side in the vertical direction. Accordingly, the distance between the heat-sink type component 2 and the casing 304 can be nearer in a region of the internal space 303 in which temperature does not rise relatively easily than in a region of the internal space 303 in which temperature rises relatively easily. Consequently, the heat radiation structure 310 according to the present example embodiment can transfer heat from a heat-sink type component to a casing in such a way that a temperature distribution of the casing becomes close to a uniform state.

Example Embodiment 4

Hereinafter, Example Embodiment 4 of the present invention is described with reference to the drawings. A heat radiation structure according to the present example embodiment has a structure combining a heat-sink type component of the heat radiation structure according to Example Embodiment 1 with a casing of the heat radiation structure according to Example Embodiment 2.

Figure 6:
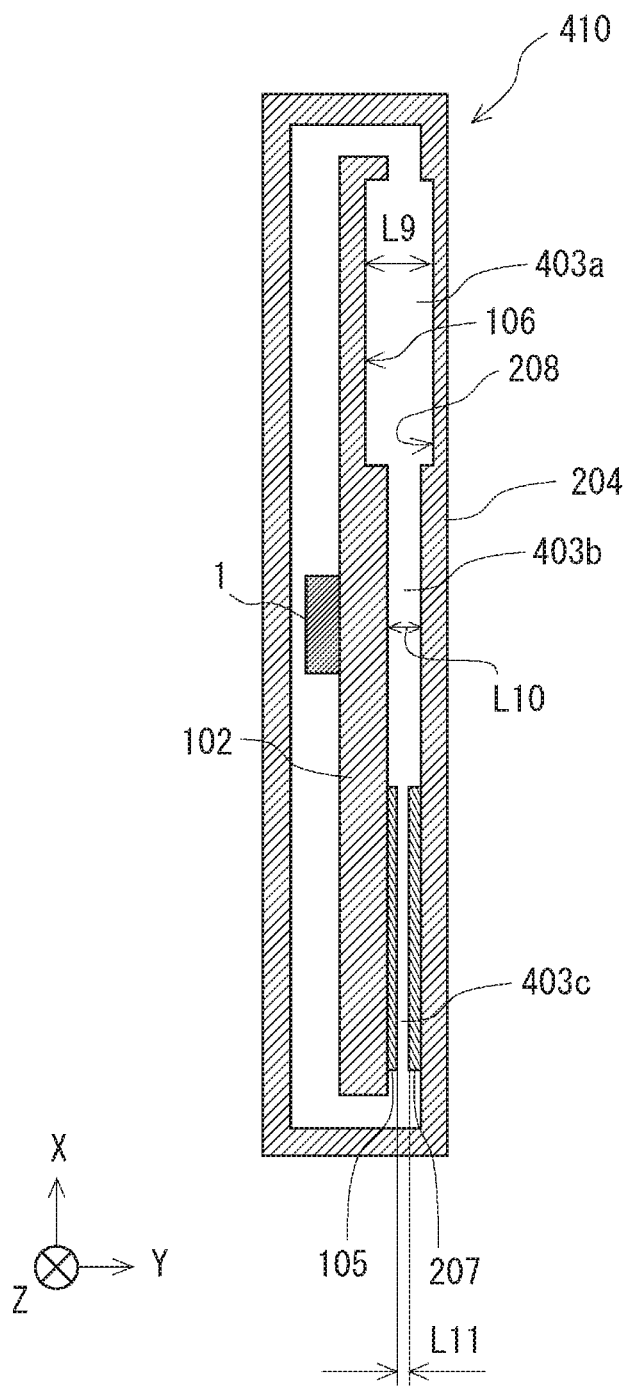
FIG. 6 is a sectional view illustrating a schematic configuration of a heat radiation structure according to Example Embodiment 4.

FIG. 6 is a sectional view illustrating a schematic configuration of a heat radiation structure 410 according to Example Embodiment 4. Note that FIG. 6 corresponds to the sectional view of the heat radiation structure 110 in Example Embodiment 1 illustrated in FIG. 3. A right-handed xyz coordinate illustrated in FIG. 6 is coincident with that in FIG. 3, and an X-axis direction is a vertical direction. As illustrated in FIG. 6, the heat radiation structure 410 includes a heating element 1, a casing 204, and a heat-sink type component 102.

As described above, a first projecting portion 105 is formed in a part contacting a low-temperature region 403c in the heat-sink type component 102, and a first depressed portion 106 is formed in a part contacting a high-temperature region 403a. Moreover, a second projecting portion 207 is formed in a part contacting the low-temperature region 403c in the casing 204, and a second depressed portion 208 is formed in a part contacting the high-temperature region 403a.

Assuming that distances between the heat-sink type component 102 and the casing 204 are L9 in the high-temperature region 403a, L10 in an intermediate-temperature region 403b, and L11 in the low-temperature region 403c, L9>L10>L11. In other words, the heat-sink type component 102 and the casing 204 are configured in such a way that, when heat is generated from the heating element 1, a distance between the heat-sink type component 102 and the casing 204 becomes nearer in a region of an internal space 403 in which temperature does not rise relatively easily than in a region of the internal space 403 in which temperature rises relatively easily. Consequently, the heat radiation structure 410 according to the present example embodiment can transfer heat from a heat-sink type component to a casing in such a way that a temperature distribution of the casing becomes close to a uniform state.

In the heat radiation structure 410 according to the present example embodiment, it is possible to acquire a secondary effect of widening width of adjustment when the heat-sink type component 102 and the casing 204 are different in material. This is because heat conductivity of a member differs depending on a material. For example, between a case where length of the first projecting portion 105 provided in the heat-sink type component 102 is extended 1 mm toward the casing 204, and a case where the second projecting portion 207 provided in the casing 204 is extended 1 mm toward the heat-sink type component 102, a distance L11 between the heat-sink type component 102 and the casing 204 in the low-temperature region 403c is the same, but surface temperatures of the casing 204 to be achieved differ from each other.

Example Embodiment 5

Hereinafter, Example Embodiment 5 of the present invention is described with reference to the drawings. In a heat radiation structure according to each of Example Embodiments 1 to 4, a distance between a heat-sink type component and a casing is adjusted only in one direction in which the heat-sink type component faces the casing, but is not limited thereto. A distance between a heat-sink type component and a casing may be adjusted according to a degree of temperature in each of a plurality of directions in which the heat-sink type component faces the casing.

Figure 7:
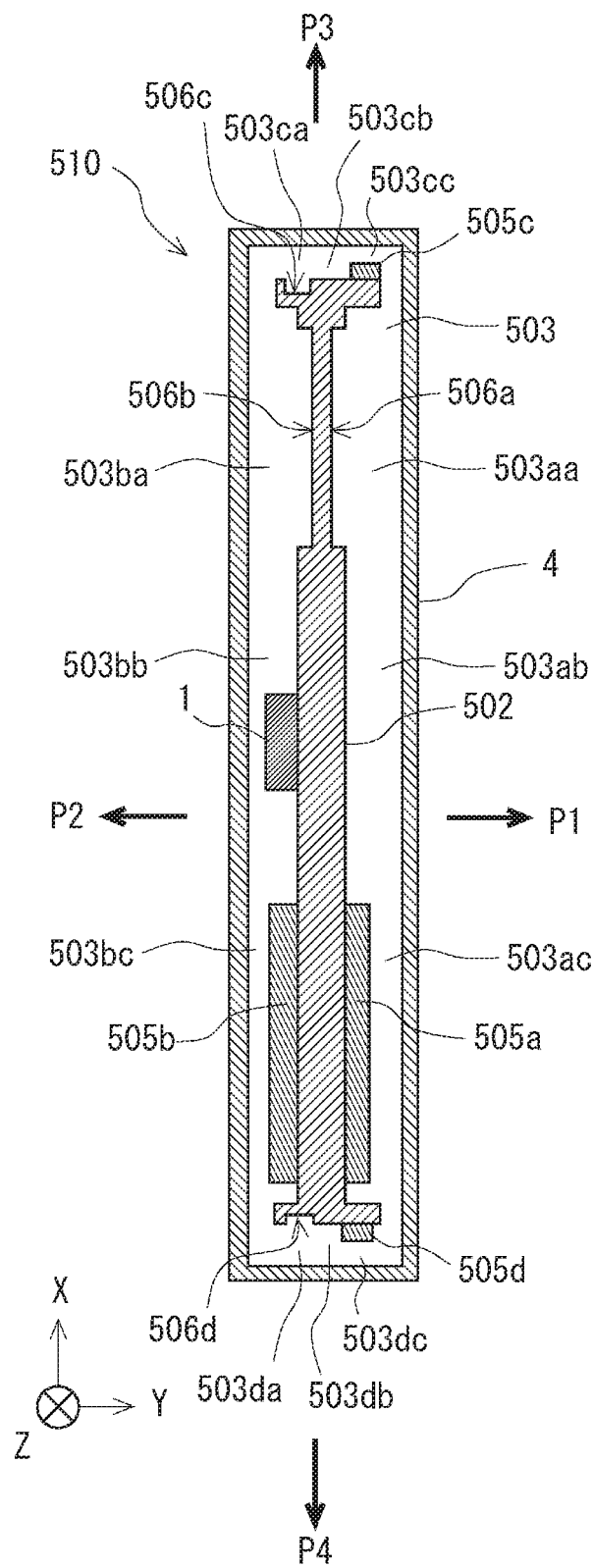
FIG. 7 is a sectional view illustrating a schematic configuration of a heat radiation structure according to Example Embodiment 5.
Figure 8:
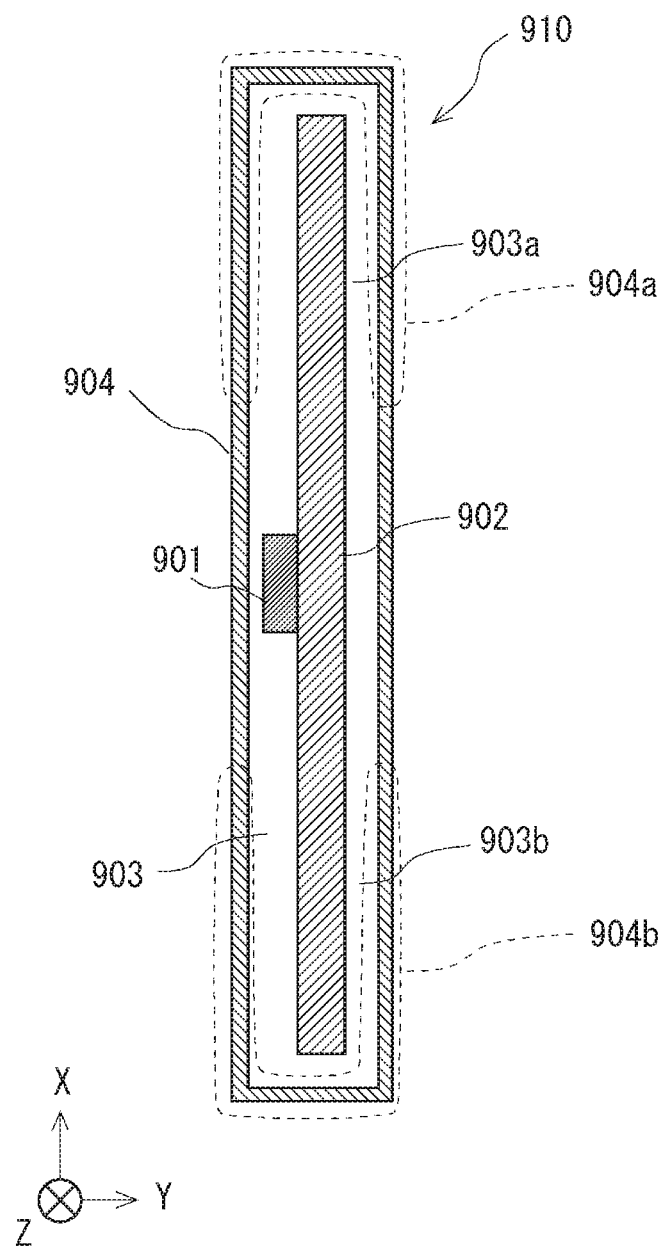
FIG. 8 is a schematic view illustrating a heat radiation structure involving a problem to be solved by the present invention.

FIG. 7 is a sectional view illustrating a schematic configuration of a heat radiation structure 510 according to Example Embodiment 5. Note that FIG. 7 corresponds to the sectional view of the heat radiation structure 110 in Example Embodiment 1 illustrated in FIG. 3. A right-handed xyz coordinate illustrated in FIG. 7 is coincident with that in FIG. 3, and an X-axis direction is a vertical direction. As illustrated in FIG. 7, the heat radiation structure 510 includes a heating element 1, a casing 4, and a heat-sink type component 502. Herein, it is assumed that, in an internal space 503 of the heat radiation structure 510, a temperature difference is made between the X-axis direction and a Y-axis direction due to an influence of natural convection or the like, and temperature is higher on a positive side than on a negative side in the X-axis direction, whereas temperature is higher on a negative side than on a positive side in the Y-axis direction. In the heat radiation structure 510, a distance between the heat-sink type component 502 and the casing 4 is adjusted according to a degree of temperature in each of a plurality of directions (directions indicated by arrows P1, P2, P3, and P4 in the drawing) in which the heat-sink type component 502 faces the casing 4.

It is assumed that, in the internal space 503 in which the heat-sink type component 502 exists in the arrow P1 direction (on the positive side in the Y-axis direction) facing the casing 4, a region being relatively high in temperature is a high-temperature region 503aa, a region being relatively low in temperature is a low-temperature region 503ac, and a region being a temperature range between the high-temperature region 503aa and the low-temperature region 503ac is an intermediate-temperature region 503ab. The heat-sink type component 502 is provided with a depressed portion 506a in a part contacting the high-temperature region 503aa, and a projecting portion 505a in a part contacting the low-temperature region 503ac. Thus, a temperature distribution on a surface perpendicular to the arrow P1 direction in the casing 4 is uniformed.

Similarly, it is assumed that, in the internal space 503 in which the heat-sink type component 502 exists in the arrow P2 direction (on the negative side in the Y-axis direction) facing the casing 4, a region being relatively high in temperature is a high-temperature region 503ba, a region being relatively low in temperature is a low-temperature region 503bc, and a region being a temperature range between the high-temperature region 503ba and the low-temperature region 503bc is an intermediate-temperature region 503bb. The heat-sink type component 502 is provided with a depressed portion 506b in a part contacting the high-temperature region 503ba, and a projecting portion 505b in a part contacting the low-temperature region 503bc. Thus, a temperature distribution on a surface perpendicular to the arrow P2 direction in the casing 4 is uniformed.

Similarly, it is assumed that, in the internal space 503 in which the heat-sink type component 502 exists in the arrow P3 direction (on the negative side in the X-axis direction) facing the casing 4, a region being relatively high in temperature is a high-temperature region 503ca, a region being relatively low in temperature is a low-temperature region 503cc, and a region being a temperature range between the high-temperature region 503ca and the low-temperature region 503cc is an intermediate-temperature region 503cb. The heat-sink type component 502 is provided with a depressed portion 506c in a part contacting the high-temperature region 503ca, and a projecting portion 505c in a part contacting the low-temperature region 503cc. Thus, a temperature distribution on a surface perpendicular to the arrow P3 direction in the casing 4 is uniformed.

Similarly, it is assumed that, in the internal space 503 in which the heat-sink type component 502 exists in the arrow P4 direction (on the negative side in the X-axis direction) facing the casing 4, a region being relatively high in temperature is a high-temperature region 503da, a region being relatively low in temperature is a low-temperature region 503dc, and a region being a temperature range between the high-temperature region 503da and the low-temperature region 503dc is an intermediate-temperature region 503db. The heat-sink type component 502 is provided with a depressed portion 506d in a part contacting the high-temperature region 503da, and a projecting portion 505d in a part contacting the low-temperature region 503dc. Thus, a temperature distribution on a surface perpendicular to the arrow P4 direction in the casing 4 is uniformed.

Consequently, the heat radiation structure 510 according to the present example embodiment can transfer heat from a heat-sink type component to a casing in such a way that a temperature distribution of the casing becomes close to a uniform state.

Note that, in the present example embodiment, naturally, a shape of a casing may be adjusted as in Example Embodiment 2, or shapes of a heat-sink type component and a casing may be adjusted as in Example Embodiment 4. Moreover, it goes without saying that a plurality of directions in which the heat-sink type component 502 faces the casing 4 may be more than four directions.

Note that the present invention is not limited to the example embodiments described above, and can be suitably modified without departing from the spirit thereof. For example, in a heat radiation structure according to the present invention, a material of a component such as a casing or a heat-sink type component may be any material. Although physical property values associated with heat transfer such as heat conductivity and emissivity change when a material of a component changes. However, changes in these physical property values associated with heat transfer are not related in a mechanism of the present invention which enables uniforming of a temperature distribution of a casing. Therefore, the present invention is applicable regardless of a material of a component in a heat radiation structure.

In the example embodiments described above, a part of a heat-sink type component contacting a region of an internal space in which temperature does not rise relatively easily may be formed by a material having higher heat conductivity than a part contacting a region of the internal space in which temperature rises relatively easily. This enables such adjustment as to make a temperature distribution of a casing more uniform.

In a heat radiation structure according to the present invention, a shape of a projecting portion provided in a heat-sink type component or a casing is not limited only to a general shape such as a longitudinal rib or a box shape. For example, a shape of a projecting portion can be any projecting shape such as a lateral rib, a cross rib, a circular column, or a semicircular column. Moreover, a shape of a depressed portion provided in a heat-sink type component or a casing is not limited only to a general shape such as a rectangular-parallelepiped groove. For example, a shape of a depressed portion can be any depressed shape such as a cross groove, a circular-column groove, or a semicircular-column groove. Moreover, a size of a projecting portion or a depressed portion may also be any size. It goes without saying that adjustment can be made in a finer range or temperature zone by the number, shape, and size of each of these portions.

A heat radiation structure according to the present invention may have a nested structure. In other words, a nested structure is a structure in which a heat radiation structure A is inside a casing of a heat radiation structure B, and the heat radiation structure A serves as a heating element in the heat radiation structure B.

Although a case where a temperature difference is made by natural convection of air in an internal space of a casing accommodating a heating element is described in the example embodiments described above, an application target of the present invention is not necessarily limited to such a case. In a case where a temperature difference is made for a reason other than natural convection of air in an internal space of a casing accommodating a heating element as well, a temperature distribution of a casing can be brought closer to a uniform state by applying a heat radiation structure according to the present invention.

REFERENCE SIGNS LIST

1 HEATING ELEMENT
2 HEAT-SINK TYPE COMPONENT
3 INTERNAL SPACE
4 CASING
10 HEAT RADIATION STRUCTURE

What is claimed is:

1. A heat radiation structure comprising:
   a casing configured to accommodate a heating element; and
   a heat-sink type component configured to directly or indirectly absorb heat from the heating element, contactlessly face the casing, and conduct the heat to the casing via air existing in an internal space of the casing,
   wherein the heat-sink type component is configured in such a way that, when the heat is generated from the heating element, a distance between the heat-sink type component and the casing becomes nearer in a first region of the internal space in which a temperature does not rise relatively easily, than in a second region of the internal space in which the temperature rises relatively easily,
   wherein, in a cross-section of the heat-sink type component, the heat-sink type component comprises thicknesses and the thicknesses comprise a first cross-sectional thickness of a first portion of the heat-sink type component that is thicker than a constant intermediate cross-sectional thickness of an intermediate portion of the heat-sink type component, the constant intermediate cross-sectional thickness is thicker than a second cross-sectional thickness of a second portion of the heat-sink type component, the intermediate portion extends from the first portion to the second portion,
   wherein the first portion is arranged in the first region,
   wherein the second portion is arranged in the second region,
   wherein, in a direction from the first portion to the second portion, the heat-sink type component comprises a first step and a second step by which the thicknesses are stepwise reduced from the first cross-sectional thickness to the constant intermediate thickness of the intermediate portion and from the constant intermediate thickness of the intermediate portion to the second cross-sectional thickness, and
   wherein, in the cross-section, the heating element is arranged on the intermediate portion of the heat-sink type component, and
   wherein, in the cross-section, the first portion is stepped to the intermediate portion by the first step, and
   wherein, in the cross-section, the intermediate portion is stepped to the second portion by the second step, and
   wherein the first region of the internal space in which the temperature does not rise relatively easily is a position lower in elevation than the second region of the internal space in which the temperature rises relatively easily.

2. The heat radiation structure according to claim 1, wherein a part of the first portion of the heat-sink type component contacting the first region of the internal space in which the temperature does not rise relatively easily is formed by a material having a higher heat conductivity than a part of the second portion of the heat-sink type component contacting the second region of the internal space in which the temperature rises relatively easily.

3. The heat radiation structure according to claim 1, wherein distances including the distance, between the heat-sink type component and the casing are adjusted according to a degree of the temperature in each of a plurality of directions in which the heat-sink type component faces the casing.

4. The heat radiation structure according to claim 1,
   wherein the first portion contacting the first region of the internal space in which the temperature does not rise relatively easily is at an opposite side of the casing as compared to the second portion contacting the second region of the internal space in which the temperature does rise relatively easily.

5. A manufacturing method of a heat radiation structure comprising:
   a casing configured to accommodate a heating element; a heat-sink type component configured to directly or indirectly absorb heat from the heating element, and conduct the heat to the casing via air existing in an internal space of the casing; and
   forming the heat-sink type component in such a way that, when the heat is generated from the heating element, a distance between the heat-sink type component and the casing becomes nearer in a first region of the internal space in which a temperature does not rise relatively easily than in a second region of the internal space in which the temperature rises relatively easily,
   wherein, in a cross-section of the heat-sink type component, the heat-sink type component comprises thicknesses and the thicknesses comprise a first cross-sectional thickness of a first portion of the heat-sink type component that is thicker than a constant intermediate cross-sectional thickness of an intermediate portion of the heat-sink type component, the constant intermediate cross-sectional thickness is thicker than a second cross-sectional thickness of a second portion of the heat-sink type component, the intermediate portion extends from the first portion to the second portion, wherein the first portion is arranged in the first region, wherein the second portion is arranged in the second region, wherein, in a direction from the first portion to the second portion, the heat-sink type component comprises a first step and a second step by which the thicknesses are stepwise reduced from the first cross-sectional thickness to the constant intermediate thickness of the intermediate portion and from the constant intermediate thickness of the intermediate portion to the second cross-sectional thickness, and wherein, in the cross-section, the heating element is arranged on the intermediate portion of the heat-sink type component, and wherein, in the cross-section, the first portion is stepped to the intermediate portion by the first step, and wherein, in the cross-section, the intermediate portion is stepped to the second portion by the second step, and wherein the first region of the internal space in which the temperature does not rise relatively easily is a position lower in elevation than the second region of the internal space in which the temperature rises relatively easily.

\* \* \* \* \*